(12) United States Patent  (10) Patent No.: US 7,750,409 B2
Takasu et al.  (45) Date of Patent: Jul. 6, 2010

(54) SEMICONDUCTOR DEVICE

(75) Inventors: Hiroaki Takasu, Chiba (JP); Takayuki Takashina, Chiba (JP); Sukehiro Yamamoto, Chiba (JP)

(73) Assignee: Seiko Instruments Inc., Chiba (JP)

( * ) Notice: Subject to any disclaimer, the term of this patent is extended or adjusted under 35 U.S.C. 154(b) by 170 days.

(21) Appl. No.: 12/191,693

(22) Filed: Aug. 14, 2008

(65) Prior Publication Data
US 2009/0050968 A1 Feb. 26, 2009

(30) Foreign Application Priority Data
Aug. 22, 2007 (JP) .............................. 2007-215550

(51) Int. Cl.
*H01L 23/62* (2006.01)
(52) U.S. Cl. ................. 257/355; 257/357; 257/E23.001
(58) Field of Classification Search ................. 257/355, 257/357, 335
See application file for complete search history.

(56) References Cited
U.S. PATENT DOCUMENTS
7,511,345 B2 * 3/2009 Van Camp et al. .......... 257/355

2007/0284663 A1 * 12/2007 Su et al. ...................... 257/355

FOREIGN PATENT DOCUMENTS
JP 7-45829 A 2/1995

* cited by examiner

*Primary Examiner*—Phat X Cao
*Assistant Examiner*—Nga Doan
(74) *Attorney, Agent, or Firm*—Brinks Hofer Gilson & Lione

(57) ABSTRACT

Provided is a semiconductor device including an n-type metal oxide semiconductor transistor for electrostatic discharge protection including drain regions connected with a first metal interconnect and source regions connected with another first metal interconnect alternately placed with each other, and gate electrodes each placed between each of the drain regions and each of the source regions, in which: at least one of the first metal interconnect and the other first metal interconnect being connected to a plurality of layers of metal interconnects other than the first metal interconnect; and the source regions include via-holes for electrically connecting the other first metal interconnect and the plurality of layers of metal interconnects other than the first metal interconnect, a greater number of the via-holes is formed as a distance of an interconnect connected to the NMOS transistor for ESD protection becomes larger.

5 Claims, 2 Drawing Sheets

SEMICONDUCTOR DEVICE

RELATED APPLICATIONS

This application claims priority under 35 U.S.C. §119 to Japanese Patent Application No. JP2007-215550 filed on Aug. 22, 2007, the entire content of which is hereby incorporated by reference.

BACKGROUND OF THE INVENTION

1. Field of the Invention

The present invention relates to a semiconductor device including a metal oxide semiconductor (MOS) transistor. In particular, the present invention relates to a semiconductor device using an n-type MOS (NMOS) transistor as an electrostatic discharge (hereinafter, referred to as ESD) protection element.

2. Description of the Related Art

In a semiconductor device including MOS transistors, an off transistor, which is an NMOS transistor provided in an off-state whose gate potential is fixed to a ground (Vss), is used as an ESD protection element for preventing breakdown of an internal circuit due to static electricity supplied from a pad provided for external connection.

Since the off transistor must flow a large amount of current generated by static electricity at once unlike ordinary MOS transistors forming an internal circuit such as a logic circuit, a large width (width W) of about several hundred micrometers is required for the transistor in many cases.

Accordingly, the off transistor often takes a form which is obtained by combining a plurality of drain regions, source regions, and gate electrodes in a comb shape.

However, the structure in which a plurality of transistors is combined causes the difficulty in uniformly operating the whole NMOS transistors for ESD protection. For example, current concentration occurs in a portion closer to the external connection terminal, resulting in the breakdown of the off transistor without sufficiently exhibiting the original ESD protection function.

As countermeasures, there is proposed a method in which a distance between a contact hole formed on a drain region and a gate electrode is made smaller as a distance from the external connection terminal becomes longer to accelerate the operation of the transistor (for example, refer to FIG. 2 of JP 7-45829 A).

However, for example, when a width W is made smaller for uniform operation of the off transistor, the protection function is not sufficiently accomplished. Further, in the method of JP 7-45829 A, the distance between the contact and the gate electrode in the drain region is adjusted to thereby locally adjust a transistor operation speed. The method, however, has problems that a desired contact position cannot be ensured along with a reduction in width of the drain region, that interconnect resistance has been made low through interconnect including a refractory metal in recent years to thereby accelerate the propagation speed of surge, which causes a case where the transistor operation speed cannot be adjusted only by the distance between the contact and the gate electrode, and that it is difficult to adapt the method to a case in which interconnect to the transistor is introduced from a direction perpendicular to the width direction of the transistor.

SUMMARY OF THE INVENTION

In order to solve the aforementioned problems, a semiconductor device according to the present invention is structured as follows.

In a semiconductor device including an n-type metal oxide semiconductor transistor for electrostatic discharge protection, the n-type metal oxide semiconductor transistor for electrostatic discharge protection having a structure in which a plurality of transistors are integrated, the n-type metal oxide semiconductor transistor for electrostatic discharge protection including a plurality of drain regions and a plurality of source regions alternately placed with each other, and a plurality of gate electrodes each placed between each of the plurality of drain regions and each of the plurality of source regions: the plurality of drain regions are electrically connected to an external connection terminal; the plurality of source regions are electrically connected to a ground potential supply line; the plurality of drain regions are connected with a first metal interconnect, and the plurality of source regions are connected with another first metal interconnect, at least one of the first metal interconnect and the another first metal interconnect being connected to a plurality of layers of metal interconnects other than the first metal interconnect and the another first metal interconnect; and the plurality of source regions include via-holes for electrically connecting the another first metal interconnect and the plurality of layers of metal interconnects other than the first metal interconnect and the another first metal interconnect, a greater number of the via-holes being formed as a distance of a interconnect connected to the n-type metal oxide semiconductor transistor for electrostatic discharge protection from outside becomes larger.

Further, the plurality of layers of metal interconnects other than the first metal interconnect and the another first metal interconnect are introduced in a direction perpendicular to a channel width direction of the n-type metal oxide semiconductor transistor for electrostatic discharge protection, the first metal interconnect is placed in a direction parallel to the channel width direction of the n-type metal oxide semiconductor transistor for electrostatic discharge protection, and the plurality of layers of metal interconnects other than the first metal interconnect and the another first metal interconnect are connected to the first metal interconnect and the another first metal interconnect via the via-holes on one of the plurality of drain regions and the plurality of source regions.

Further, the via-holes are placed to be widely distributed in the direction parallel to the channel width direction of the n-type metal oxide semiconductor transistor for electrostatic discharge protection on one of the plurality of drain regions and the plurality of source regions.

Alternatively, the via-holes are placed to be concentrated on one of a part of each of the plurality of drain regions and a part of each of the plurality of source regions.

As described above, according to the present invention, even in the case where the interconnect introduced to the n-type metal oxide semiconductor transistor for electrostatic discharge protection is introduced in the direction perpendicular to the channel width direction of the n-type metal oxide semiconductor transistor for electrostatic discharge protection using a high-speed multilayer interconnect including a refractory metal, employment of those means enables the interconnect to uniformly operate in the entire n-type metal oxide semiconductor transistor for electrostatic discharge protection.

Accordingly, the semiconductor device including the n-type metal oxide semiconductor transistor for electrostatic discharge protection provided with a sufficient electrostatic discharge protection function can be obtained.

DETAILED DESCRIPTION OF THE PREFERRED EMBODIMENTS

First Embodiment

Figure 1:
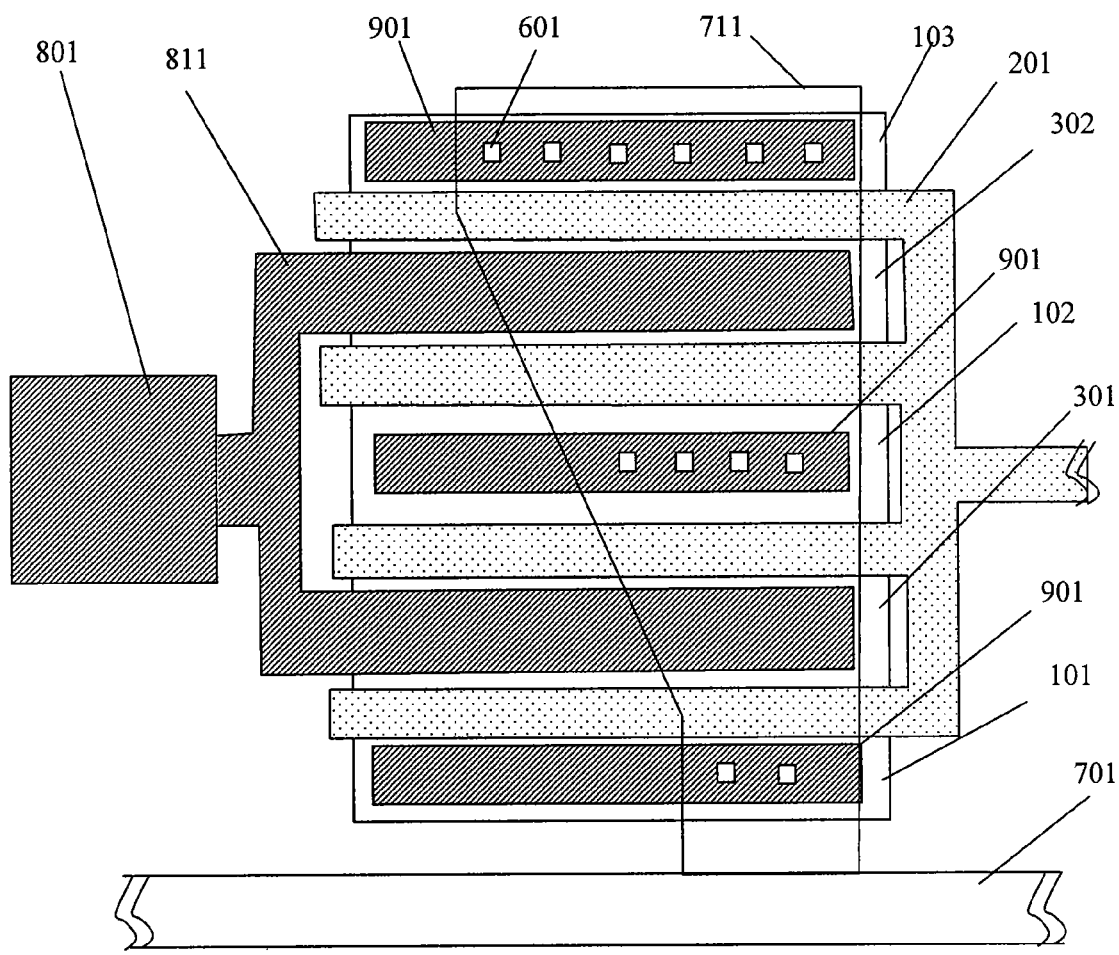
FIG. 1 is a schematic plan view showing an NMOS transistor for ESD protection of a semiconductor device according to a first embodiment of the present invention.

FIG. 1 is a schematic plan view showing an NMOS transistor for ESD protection of a semiconductor device according to a first embodiment of the present invention.

A first source region 101 and a first drain region 301 are formed of an n-type heavily-doped impurity region. Between the first source region 101 and the first drain region 301, a gate insulating film (not shown) made of a silicon oxide film or the like is formed, and on a top surface thereof, gate electrodes 201 made of a polysilicon or the like are formed. Then, in a repeated pattern, there are formed a second source region 102 via the gate electrode 201, a drain region 302 via the gate electrode 201, and a third source region 103 via the gate electrode 201 from the first drain region 301 side. The first embodiment shows an example in which three source regions, two drain regions, and four gate electrodes are placed. As a MOS transistor, four transistors are combined.

In this case, a ground potential is supplied to the first source region 101, the second source region 102, and the third source region 103, by means of a second metal interconnect 711 which is formed of a material including a refractory metal and is connected to a ground potential supply line 701 formed of the metal material including the refractory metal and formed of a wide interconnect having a low resistance. The second metal interconnect 711 is connected from the ground potential supply line 701 in a direction perpendicular to a channel width direction of the NMOS transistor for ESD protection, and is connected to a first metal interconnect 901 formed of the material including the refractory metal. Further, though not shown for simplicity, the second metal interconnect 711 is connected to the first source region 101, the second source region 102, and the third source region 103 via contact holes.

In this case, as for via-holes 601, the largest number thereof are set on the third source region 103 placed farthest from the ground potential supply line 701, and the smallest number thereof are set on the first source region 101 placed closest to the ground potential supply line 701.

When the number of via-holes is set to an appropriate number, as for the first source region 101, the second source region 102, and the third source region 103, sums of interconnect resistances of the second metal interconnect 711 connected to the ground potential supply line 701 and connection resistances through the via-holes 601 can be made substantially to be equal to one another, with the result that a uniform operation can be achieved in the entire NMOS transistor for ESD protection without being concentrated on a part close to the ground potential supply line 701.

This embodiment shows a case where a thickness of the second metal interconnect 711 increases as a distance between the ground potential supply line 701 and the second metal interconnect 711 becomes larger, and with such a structure, an effect of the interconnect resistance of the second metal interconnect 711 can be mitigated.

On the other hand, an external connection terminal 801 is connected with a first metal interconnect 811 made of the material including the refractory metal, and is introduced to the first drain region 301 and the second drain region 302. The first drain region 301 and the drain region 302 are connected to the first metal interconnect 811 via the contact holes, which is not shown.

The first embodiment of FIG. 1 shows an example in which the interconnect for supplying and fixing the potentials of the source regions of the NMOS transistor for ESD protection is the second metal interconnect, and the interconnect connected to the drain regions is the first metal interconnect. In contrast, the first metal interconnect may be the line for supplying and fixing the potentials of the source regions, the second metal interconnect may be the line connected to the drains, or a combination thereof may be conducted at will. In that case, it is essential that the number of via-holes placed on a side where the second metal interconnect is used be set so that, according to the gist of the description of the first embodiment shown in FIG. 1, the sums of the interconnect resistances introduced to the plurality of drain regions or source regions of the NMOS transistor for ESD protection and the resistances among the interconnects are substantially equal.

The first embodiment of FIG. 1 shows an example in which two layers of metal interconnects are used, but a plurality of metal layers equal to or more than three layers may be used. In such a case, attention must be paid to the similar points as in the case of using two layers described above.

Second Embodiment

Figure 2:
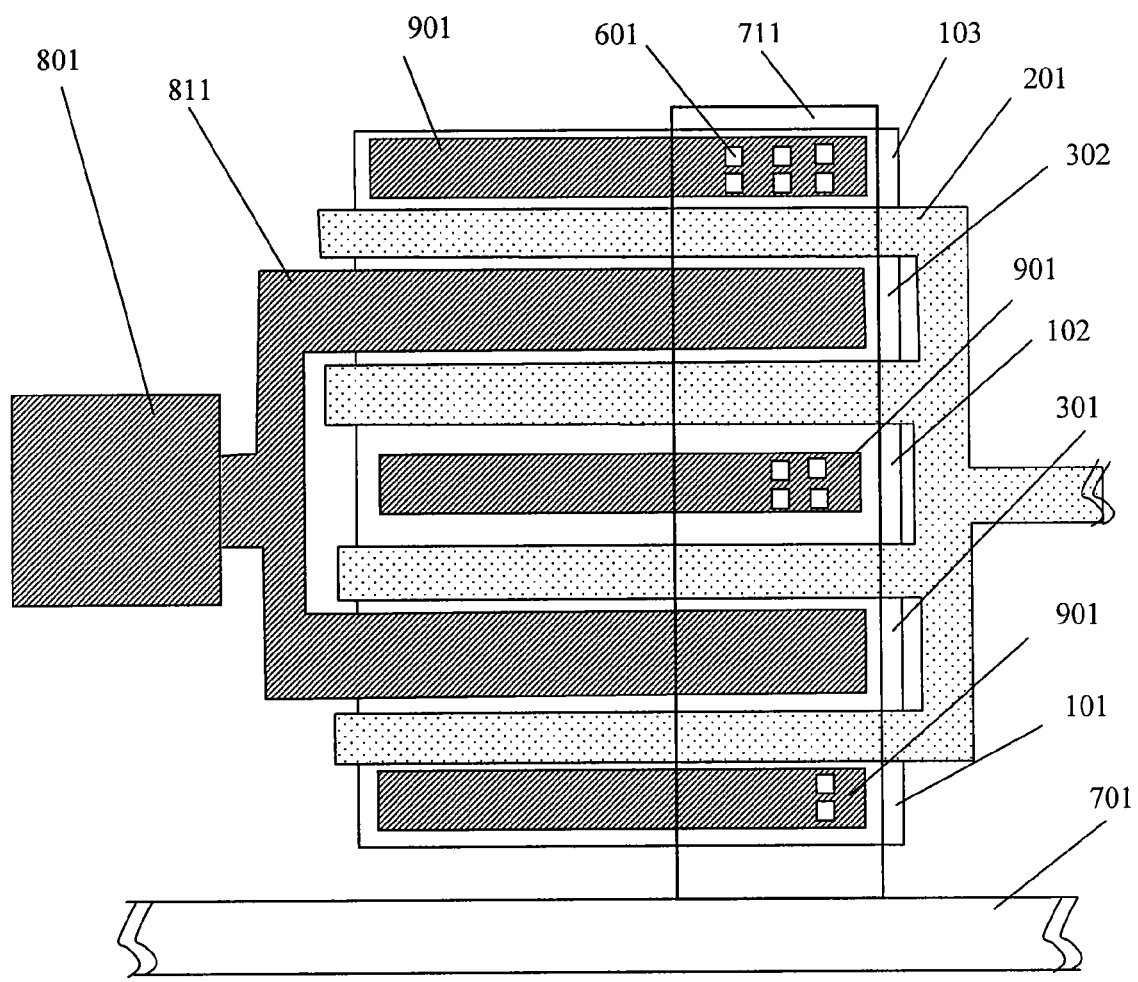
FIG. 2 is a schematic plan view showing an NMOS transistor for ESD protection of a semiconductor device according to a second embodiment of the present invention.

FIG. 2 is a schematic plan view showing an NMOS transistor for ESD protection of a semiconductor device according to a second embodiment of the present invention. Parts corresponding to the parts of FIG. 1 are denoted by the same reference numerals. The second embodiment of the present invention is different from the first embodiment of the present invention in an arrangement of the via-holes 601. In the first embodiment shown in FIG. 1, the via-holes 601 placed on the first source region 101, the second source region 102, and the third source region 103 are placed in a shape of being widely distributed in a direction parallel to the channel width direction of the NMOS transistor for ESD protection. On the other hand, in the second embodiment shown in FIG. 2, the via-holes 601 are placed on a part of each of the first source region 101, the second source region 102, and the third source region 103.

This is a result of paying attention to the connection of the first metal interconnect 811 to the first drain region 301 and the second drain region 302. In other words, the metal interconnect 811 coming from the external connection terminal 801 is introduced to the first drain region 301 and the second drain region 302 from one end of the first drain region 301 and one end of the second drain region 302, respectively, and thus the interconnect resistance of the metal line 811 differs between a side close to and a side apart from the external connection terminal 801 in the channel width direction.

Accordingly, the portion of the first drain region 301 and the portion of the second drain region 302, which are closer to the external connection terminal 801, become relatively easy to operate.

In view of this circumstance, it is aimed that, in the first source region 101 and the second source region 102 which are paired with the first drain region 301 and the second drain region 302, respectively, and the third source region 103, the via-holes 601 are provided so as to be concentrated in regions apart from the external connection terminal 801, with the result that generation of distance dependence to the external connection terminal 801 in the channel width direction is mitigated during operation of the NMOS transistor for ESD protection.

The second embodiment of FIG. 2 shows an example in which the second metal interconnect is the line for supplying and fixing the potentials of the source regions of the NMOS transistor for ESD protection, and the first metal interconnect is the line connected to the drain regions. However, as in the example of FIG. 1, the first metal interconnect may be the line for supplying and fixing the potentials of the source regions, the second metal interconnect may be the line connected to the drain regions, or a combination thereof may be conducted at will.

In such a case, as in the example of FIG. 1, it is essential that the number of via-holes placed on the side where the second metal interconnect is used be set so that, according to the gist of the description of the first embodiment shown in FIG. 1, the sums of the interconnect resistances introduced to the plurality of drain regions or source regions of the NMOS transistor for ESD protection and the resistances among the interconnects are substantially equal, and a plurality of metal interconnects equal to or more than three layers may be used. Other parts are denoted by the same reference numerals as FIG. 1, and thus their descriptions are omitted.

What is claimed is:

1. A semiconductor device comprising:

an n-type metal oxide semiconductor transistor for electrostatic discharge protection having a structure in which a plurality of transistors is integrated, and comprising a plurality of drain regions electrically connected to an external connection terminal, a plurality of source regions electrically connected to a ground potential supply line alternately placed with each other, and a plurality of gate electrodes each placed between each of the plurality of drain regions and each of the plurality of source regions, wherein the plurality of drain regions are connected with a first metal interconnect, and the plurality of source regions are connected with another first metal interconnect, at least one of the first metal interconnect and the another first metal interconnect being connected to a plurality of layers of metal interconnects other than the first metal interconnect and the another first metal interconnect; and wherein the plurality of source regions include via-holes for electrically connecting the another first metal interconnect and the plurality of layers of metal interconnects other than the first metal interconnect and the another first metal interconnect, a greater number of the via-holes being formed as a distance of an interconnect connected to the n-type metal oxide semiconductor transistor for electrostatic discharge protection from outside becomes larger.

2. A semiconductor device according to claim 1:

wherein the plurality of layers of metal interconnects other than the first metal interconnect and the another first metal interconnect are lined in a direction perpendicular to a channel width direction of the n-type metal oxide semiconductor transistor for electrostatic discharge protection;

wherein the first metal interconnect is placed in a direction parallel to the channel width direction of the n-type metal oxide semiconductor transistor for electrostatic discharge protection; and wherein the plurality of layers of metal interconnects other than the first metal interconnect and the another first metal interconnect are connected to the first metal interconnect and the another first metal interconnect via the via-holes on one of the plurality of drain regions and the plurality of source regions.

3. A semiconductor device according to claim 2, wherein the via-holes are placed to be widely distributed in the direction parallel to the channel width direction of the n-type metal oxide semiconductor transistor for electrostatic discharge protection on one of the plurality of drain regions and the plurality of source regions.

4. A semiconductor device according to claim 2, wherein the via-holes are placed to be concentrated on one of a part of each of the plurality of drain regions and a part of each of the plurality of source regions.

5. A semiconductor device according to claim 1, wherein the first metal interconnect, the another first metal interconnect, and the plurality of layers of metal interconnects other than the first metal interconnect and the another first metal interconnect include a refractory metal.

* * * * *